(12) United States Patent
Kwak

(10) Patent No.: US 7,982,258 B2
(45) Date of Patent: Jul. 19, 2011

(54) FLASH MEMORY DEVICE AND METHOD FOR MANUFACTURING THE DEVICE

(75) Inventor: Cheol-Sang Kwak, Icheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 214 days.

(21) Appl. No.: 12/344,436

(22) Filed: Dec. 26, 2008

(65) Prior Publication Data

US 2009/0166707 A1 Jul. 2, 2009

(30) Foreign Application Priority Data

Dec. 27, 2007 (KR) ........................ 10-2007-0138321

(51) Int. Cl.
*H01L 29/78* (2006.01)
*H01L 21/336* (2006.01)
(52) U.S. Cl. .......... 257/316; 257/E21.409; 257/E29.255
(58) Field of Classification Search .................. 257/315, 257/316, E21.409, E29.255
See application file for complete search history.

(56) References Cited

U.S. PATENT DOCUMENTS

| 7,358,560 | B2 * | 4/2008 | Lee | 257/315 |
| 2001/0032996 | A1 * | 10/2001 | Inoue | 257/314 |
| 2007/0010056 | A1 * | 1/2007 | Kim | 438/257 |

* cited by examiner

*Primary Examiner* — Victor Mandala
*Assistant Examiner* — Whitney Moore
(74) *Attorney, Agent, or Firm* — Sherr & Vaughn, PLLC

(57) ABSTRACT

A flash memory device and a method for manufacturing the device includes forming a device isolation layer in a semiconductor substrate defining active regions, forming a control gate layer over the entire upper surface of the semiconductor substrate, forming a gate mask over the control gate layer, the gate mask being used to provide gate lines on the device isolation layer with grooves at positions opposite each other, and forming the grooves by etching the control gate layer using the gate mask as an etching mask, and forming the gate lines on the device isolation layer. A common source line can be more easily defined during a SAS process including photography and etching processes, and a reduced source resistance can be accomplished, resulting in an improvement in characteristics of the flash memory device.

10 Claims, 5 Drawing Sheets

FLASH MEMORY DEVICE AND METHOD FOR MANUFACTURING THE DEVICE

The present application claims priority under 35 U.S.C. §119 to Korean Patent Application No. 10-2007-0138321 (filed on Dec. 27, 2007), which is hereby incorporated by reference in its entirety.

BACKGROUND

Semiconductor memory devices may be classified into volatile memory devices that lose contents stored of a memory when power is interrupted, and non-volatile memory devices that do not lose contents stored of a memory even if power is interrupted. Recently, of the non-volatile memory devices, the use of a flash memory device is increasing. A flash memory device includes a thin tunnel oxide layer formed on a silicon substrate, a floating gate and control gate sequentially stacked with a dielectric layer interposed therebetween, and source/drain regions formed in exposed regions of the substrate. In addition, each transistor of a flash memory device is capable of storing one bit and the flash memory device performs electrical programming and erasure. Such a flash memory device has a source connecting layer, which connects sources of respective unit cells to form a source line. The source connecting layer may be formed via a metal contact method wherein contacts, formed in the sources of the respective unit cells, are connected with one another. However, the metal contact method is not appropriate for highly integrated devices when considering contact margin. Therefore, to realize high integration of devices, a common source line, which is formed as a dopant diffusion layer via a Self-Aligned-Source (SAS) process, has been frequently used in recent years.

Figure 1:
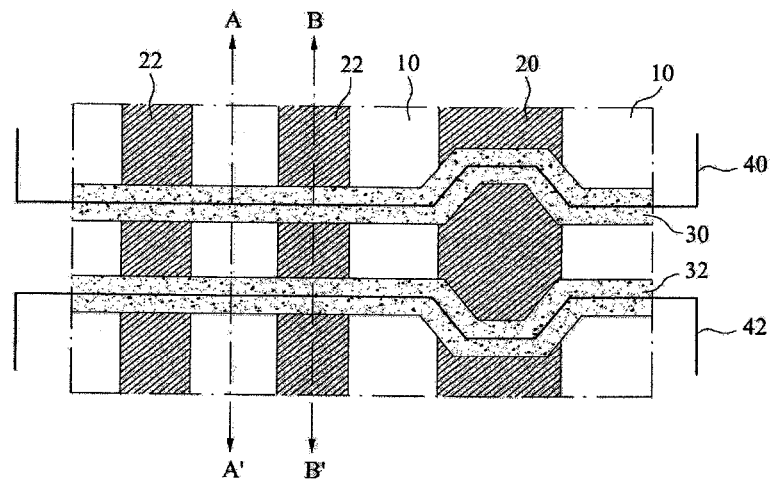

FIG. 1 is a layout of a flash memory device which includes a device isolation layer 10, active regions 20, 22, and gate lines 30, 32. SAS masks 40, 42 are used in a SAS process. Referring to FIG. 1, the device isolation layer 10 is formed in the semiconductor substrate to define the active regions 20, 22. After defining the active regions 20, 22 and forming a floating gate pattern, control gates are formed. With relation to patterning of the control gates, a common source corresponds to a space between the neighboring control gates. Subsequently, a SAS process causes chained active source resistors.

Figure 2A:
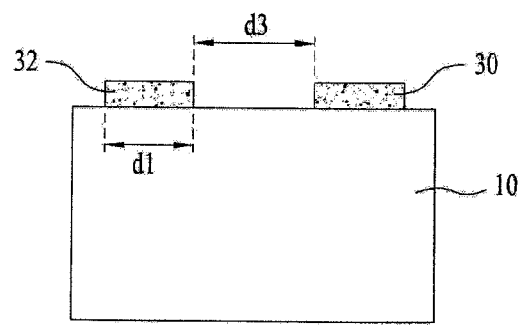
Figure 2B:
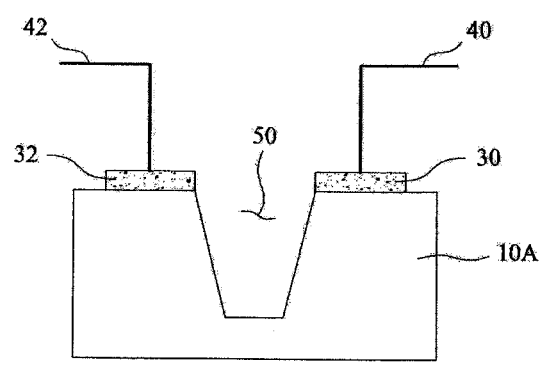

FIGS. 2A and 2B are sectional views taken along line A-A' of FIG. 1. As shown in FIG. 2A, the gate lines 30, 32 are formed on and/or over the device isolation layer 10 with a predetermined interval. Then, when performing a SAS process, as shown in FIG. 2B, a trench 50 is formed in the device isolation layer 10A between the neighboring gate lines 30 and 32.

Figure 3A:
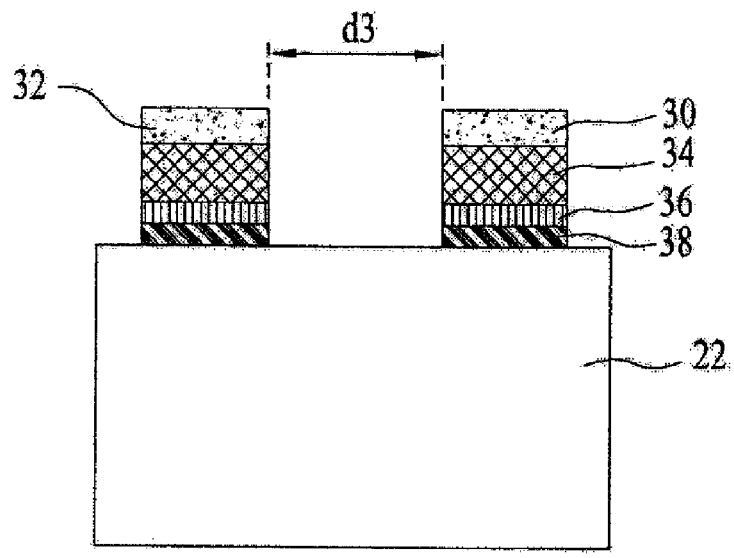
Figure 3B:
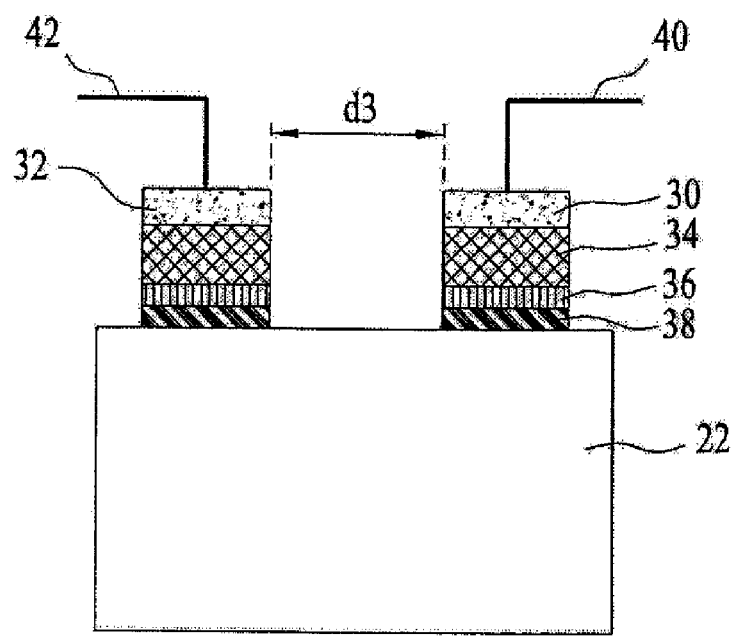

FIGS. 3A and 3B are sectional views taken along line B-B' of FIG. 1. As shown in FIG. 3A, a gate pattern is formed on and/or over the active region 22 with a predetermined interval. The gate pattern includes gate lines 30, 32 corresponding to the control gates, a dielectric layer 34, a floating gate 36, and a tunnel oxide layer 38. Next, as shown in FIG. 3B, a SAS process using the SAS masks 40, 42 is performed. In most memory cells less than 0.25 μm or 0.18 μm, shallow trench isolation (STI) technology is used. The STI technology is important to reduce a cell size in a word line (WL) direction and the SAS technology is essential to reduce a cell size in a bit line (BL) direction. Simultaneously using the two technologies, however, entails a problem of excessively increasing source resistance. In consideration of design rule shrinkage, an effort to reduce a space width has been continued.

However, as the space width decreases, the source resistance increases, deteriorating programming/reading speeds and resulting in a negative effect on products.

SUMMARY

Embodiments relate to a flash memory device and a method for manufacturing the device which can easily define a common source line and reduce a source resistance.

Embodiments relate to a method for manufacturing a flash memory device that may include at least one of the following: forming a device isolation layer in a device isolation region defined in a semiconductor substrate, the semiconductor substrate being further defined with an active region; forming a control gate layer on and/or over the entire upper surface of the semiconductor substrate; forming a gate mask on and/or over the control gate layer, the gate mask being used to provide gate lines on and/or over the device isolation layer with grooves at positions opposite each other; and forming the grooves by etching the control gate layer using the gate mask as an etching mask, and forming the gate lines on and/or over the device isolation layer.

Embodiments relate to a flash memory device that may include at least one of the following: a device isolation layer formed in a device isolation region defined in a semiconductor substrate, the semiconductor substrate being further defined with an active region; and gate lines having grooves at positions opposite each other on and/or over the device isolation layer.

Embodiments relate to a method that may include at least one of the following: forming a device isolation layer in a device isolation region of a semiconductor substrate to defining active regions; and then forming a control gate layer over the entire upper surface of the semiconductor substrate; and then forming a gate mask over the control gate layer to provide gate lines on the device isolation layer; and then forming grooves at positions opposite each other by etching the control gate layer using the gate mask as an etching mask; and then forming gate lines over the device isolation layer.

Embodiments relate to a method that may include at least one of the following:

Embodiments relate to a device that may include at least one of the following: a device isolation layer formed in a device isolation region of a semiconductor substrate to define an active region in the semiconductor substrate; and gate lines formed spaced apart from each other over the device isolation layer, wherein the gate lines have grooves formed therein, the grooves of respective gate lines being formed at positions opposite each other.

Embodiments relate to a device that may include at least one of the following: a device isolation layer formed in a semiconductor substrate to define an active region in the semiconductor substrate; a first gate pattern formed over the semiconductor substrate, the first gate pattern including a first tunnel oxide layer, a first floating gate, a first dielectric layer, and a first gate line serving as a first control gate, the portions of the first gate line formed over the device isolation layer includes a first groove; a second gate pattern formed over the semiconductor substrate spaced apart from the first gate pattern, the second gate pattern including a second tunnel oxide layer, a second floating gate, a second dielectric layer, and a second gate line serving as a second control gate, the portions of the second gate line formed over the device isolation layer includes a second groove formed opposite to the first groove; a trench formed in the device isolation layer between the first and second gate lines; and a common source line formed by implanting ions into the trench.

DRAWINGS

FIGS. 1 to 3 illustrate a flash memory device.

Example FIGS. 4 to 7 illustrate a flash memory device and a flowchart illustrating a method for manufacturing a flash memory device in accordance with embodiments.

DESCRIPTION

Figure 4:
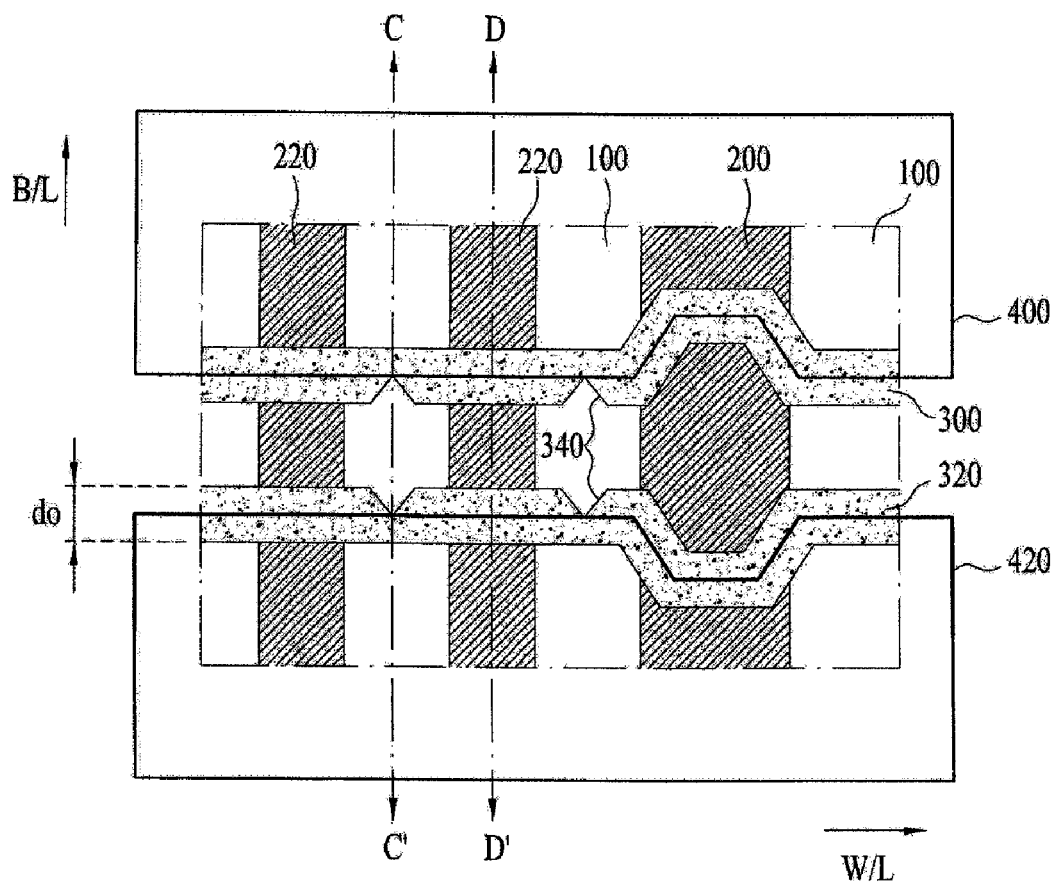

In accordance with embodiments, the flash memory device shown in example FIG. 4 is a NOR type flash memory device. Referring to example FIG. 4, a semiconductor substrate is defined with a device isolation layer 100 and active regions 200, 220. The active region 200 is a common source active region, and the active region 220 is a cell active region. Gate lines 300, 320 are formed in a word line direction WL perpendicular to a bit line direction BL. In accordance with embodiments, the gate lines 300, 320 have grooves 340 formed therein over the device isolation layer 100 at positions opposite each other in the bit line direction BL. The grooves 340 may be formed in the bit line direction BL at a position in which the device isolation layer 100 is exposed by a SAS mask. A width of the grooves 340 may be a half a gate line width $d_o$ in the BL direction.

Figure 5A:
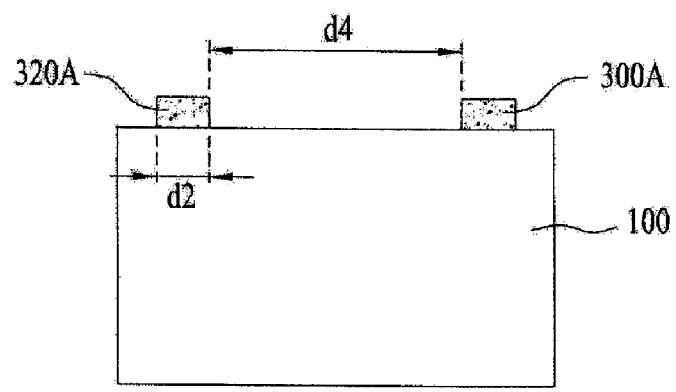
Figure 5B:
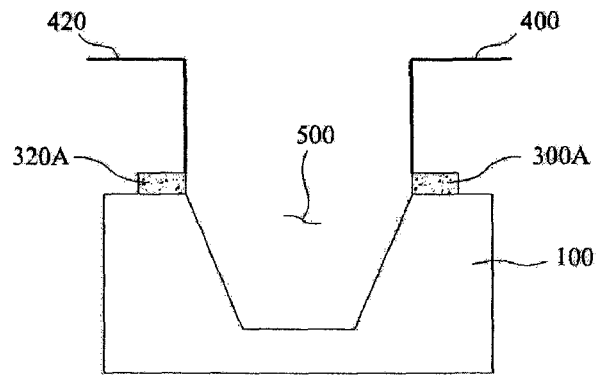

Example FIGS. 5A and 5B are sectional views taken along line C-C' of example FIG. 4. For convenience of description, the gate lines 300, 320 having the grooves 340 are designated by reference numerals 300A, 320A, respectively. As shown in example FIG. 5A, a width d2 of the gate lines 320A, 300A formed on and/or over the device isolation layer 100 is less than a width d1 of the gate lines 30, 32 shown in FIG. 2A. This is because the grooves 340 are formed within the device isolation layer 100 at positions opposite each other in the bit line direction BL during formation of the gate lines 300, 320. Next, as shown in example FIG. 5B, ions are implanted into a trench 500 that is formed via a SAS process, so as to form a common source line. In accordance with embodiments, a distance d4 between the gate lines 300A, 320A shown in example FIG. 5A is greater than a distance d3 between the gate lines 30, 32 shown in FIGS. 2A and 2B. Accordingly, a region where a common source line will be formed during photography and etching processes can be easily defined, and a greater amount of ions can be implanted into an inner wall of the trench 500. As the amount of ions implanted into the trench 500 increases, source resistance can be reduced.

Figure 6A:
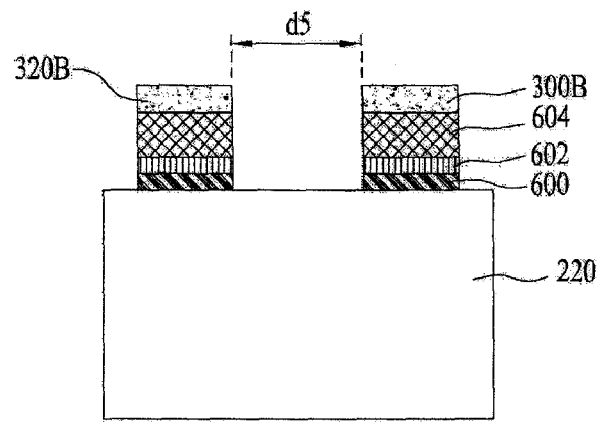
Figure 6B:
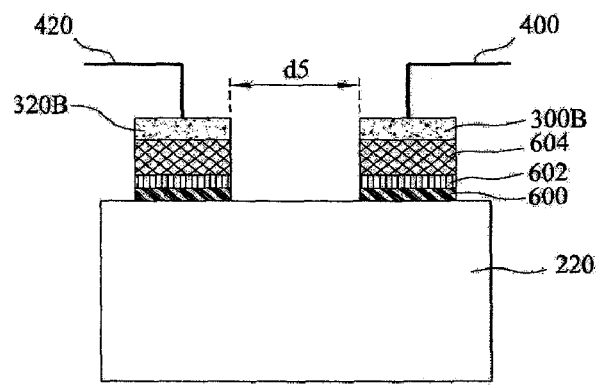

Example FIGS. 6A and 6B are sectional views taken along line D-D' of FIG. 4. For convenience of description, the gate lines 300, 320 having no grooves 340 are designated by reference numerals 300B, 320B, respectively. The gate pattern includes a tunnel oxide layer 600, a floating gate 602, a dielectric layer 604, and gate lines 300B, 320B as control gates. Once the gate lines 300B, 320B are formed in the active region 200, a distance d5 between the gate lines 300B, 320B shown in example FIG. 6A is equal to a distance d3 between the gate lines 30, 32 of the flash memory device shown in FIG. 3A. As shown in example FIG. 6B, even after performing the SAS process, the distance between the gate lines 300B, 320B in the active region 220 is not changed.

Accordingly, as shown in example FIG. 4, even if the grooves 340 are formed in the gate lines 300A, 320A over the device isolation layer 100, no groove 340 is formed in the active region 220 and therefore, the grooves 340 have no effect on channels of a flash memory device.

Figure 7:
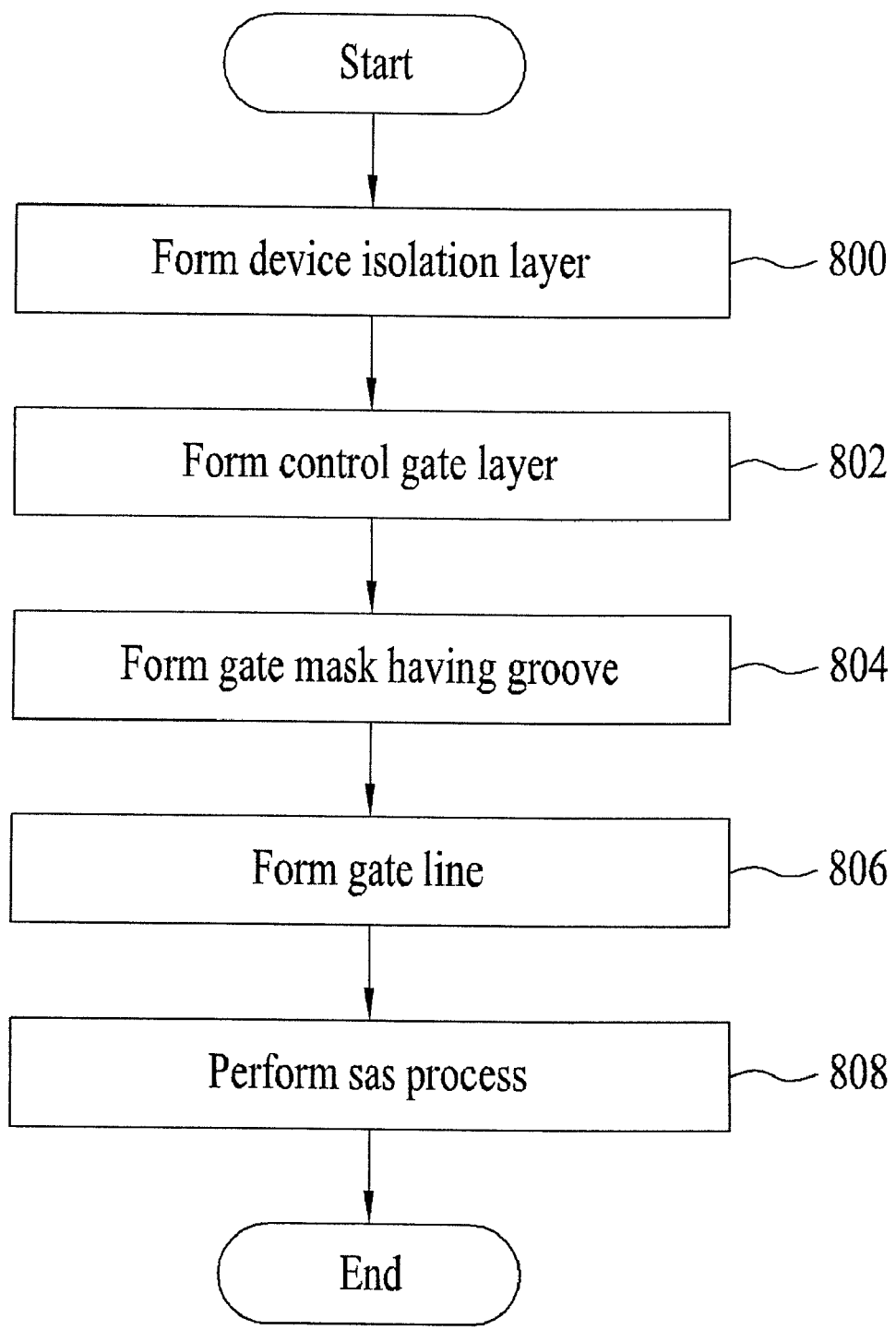

Example FIG. 7 is a flowchart illustrating a method for manufacturing a flash memory device in accordance with embodiments. Referring to example FIGS. 4 and 7, a semiconductor substrate is formed with the device isolation layer 100 to define a device isolation region and the active regions 200, 220 in the semiconductor substrate (step 800). Various methods may be used to form the device isolation layer 100. For example, after forming a dielectric layer on and/or over the entire surface of the semiconductor substrate via deposition, a trench is formed using a photoresist mask. The device isolation layer 100 can be formed by gap-filling a dielectric substance into the trench and flattening the gap-filled dielectric substance.

After completing the step 800, a control gate layer is formed on and/or over the entire upper surface of the semiconductor substrate, i.e. throughout the active regions and the device isolation region (step 802). Prior to forming the control gate layer, as shown in example FIGS. 6A and 6B, the tunnel oxide layer 600, floating gate 602, dielectric layer 604 and control gates 300B, 320B can be formed in the active regions 200, 220. Specifically, a first oxide layer to form the tunnel oxide layer 600 is deposited on and/or over the entire surface of the semiconductor substrate. Then, a first poly-silicon layer to form the floating gate 602 is deposited on and/or over the entire surface of the first oxide layer, and the dielectric layer 604 is deposited on and/or over the entire surface of the first poly-silicon layer. Thereafter, the first oxide layer, first poly-silicon layer and dielectric layer are patterned, so as to form the tunnel oxide layer 600, floating gate 602 and dielectric layer 604. The dielectric layer 604 may have an Oxide-Nitride-Oxide (ONO) structure.

After completing the step 802, a first gate mask is formed on and/or over the control gate layer such that the gate lines 300, 320 are formed with the grooves 340 within the device isolation layer 100 at positions opposite each other in the bit line direction BL (step 804). The first gate mask is formed on and/or over the control gate layer within the device isolation region.

After completing the step 804, the control gate layer is etched using the first gate mask as an etching mask, so as to form the gate lines 300A, 320A as control gates (step 806). To form the control gates in the active regions 200, 220, a second gate mask having no groove, unlike the first gate mask, is used. More specifically, the second gate mask is formed over the control gate layer within the active regions. Thereafter, the control gate layer is etched using the second gate mask as an etching mask, so as to form the gate lines 300A, 320A as control gates in the active regions 200 and 220.

After completing the step 806, a self-aligned-source (SAS) process is performed using SAS masks 400, 420 which expose some portions of the gate lines 300, 320 and spaces between the gate lines 300, 320 (step 808). Specifically, after opening a cell source region by use of the SAS masks 400, 420 in a state wherein the gate lines are formed, a SAS process, wherein the device isolation layer 100 gap-filled in the dielectric layer is removed via anisotropic etching to form the trench 500 as shown in example FIG. 5B, is performed to form a common source line with neighboring cells. Thereafter, as ions are forcibly implanted into the trench 500, the common source line can be produced.

As apparent from the above description, in accordance with embodiments, gate lines are formed with grooves in a device isolation layer at positions opposite each other, whereby a width between control gates formed on the device isolation layer can be increased. Further, a common source line can be more easily defined during a SAS process including photography and etching processes, and a reduced source resistance can be accomplished, resulting in an improvement in characteristics of a flash memory device.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A device comprising:
a device isolation layer formed in a device isolation region of a semiconductor substrate to define an active region in the semiconductor substrate; and
gate lines formed spaced apart from each other over the device isolation layer, wherein the gate lines have grooves formed therein, the grooves of respective gate lines being formed at positions opposite each other,
wherein the grooves are formed to increase a width between the gate lines at the region of the device isolation layer.

2. The device of claim 1, wherein the flash memory device is a NOR type.

3. The device of claim 1, wherein each groove is etched at a position where the device isolation layer is exposed.

4. The device of claim 1, wherein a width of the grooves is one-half a width of the gate lines.

5. The device of claim 1, wherein the grooves are formed in a bit line direction.

6. The device of claim 1, further comprising:
a trench formed in the device isolation layer between the gate lines; and
a common source line formed by implanting ions into the trench.

7. A device comprising:
a device isolation layer formed in a semiconductor substrate to define an active region in the semiconductor substrate;
a first gate pattern formed over the semiconductor substrate, the first gate pattern including a first tunnel oxide layer, a first floating gate, a first dielectric layer, and a first gate line serving as a first control gate, wherein portions of the first gate line formed over the device isolation layer includes a first groove;
a second gate pattern formed over the semiconductor substrate spaced apart from the first gate pattern, the second gate pattern including a second tunnel oxide layer, a second floating gate, a second dielectric layer, and a second gate line serving as a second control gate, wherein portions of the second gate line formed over the device isolation layer includes a second groove formed opposite to the first groove;
a trench formed in the device isolation layer between the first and second gate lines; and
a common source line formed by implanting ions into the trench,
wherein the first and second grooves are formed to increase a width between the first gate pattern and the second gate pattern at the region of the device isolation layer.

8. The device of claim 7, wherein a width of the first and second grooves is one-half a width of the first and second gate lines.

9. The device of claim 7, wherein the first and second grooves are formed at a position where the device isolation layer is exposed.

10. The device of claim 7, wherein the first and second grooves are formed in a bit line direction.

* * * * *